US012592268B2

(12) United States Patent
Sivero et al.

(10) Patent No.: US 12,592,268 B2
(45) Date of Patent: Mar. 31, 2026

(54) DEVICES, METHODS, AND SYSTEMS FOR CALIBRATING A READ VOLTAGE USED FOR READING MEMORY CELLS

(71) Applicant: Ferroelectric Memory GmbH, Dresden (DE)

(72) Inventors: Stefano Sivero, Comun Nuovo (IT); Alessandro Palludo, Milan (IT)

(73) Assignee: Ferroelectric Memory GmbH, Dresden (DE)

( * ) Notice: Subject to any disclaimer, the term of this patent is extended or adjusted under 35 U.S.C. 154(b) by 211 days.

(21) Appl. No.: 18/106,872

(22) Filed: Feb. 7, 2023

(65) Prior Publication Data
US 2024/0265959 A1    Aug. 8, 2024

(51) Int. Cl.
*G11C 11/22* (2006.01)
*G11C 16/26* (2006.01)
*G11C 16/34* (2006.01)

(52) U.S. Cl.
CPC ........ *G11C 11/2273* (2013.01); *G11C 11/221* (2013.01); *G11C 11/2275* (2013.01)

(58) Field of Classification Search
CPC .............. G11C 11/2273; G11C 11/221; G11C 11/2275; G11C 16/26; G11C 16/3404
See application file for complete search history.

(56) References Cited

U.S. PATENT DOCUMENTS

2005/0237799 A1* 10/2005 Fukuoka ................ G11C 16/16
                                            365/185.3
2007/0036007 A1*  2/2007 Lann ...................... G11C 16/28
                                            365/189.09
2013/0064008 A1*  3/2013 Kim ..................... G11C 11/1673
                                            365/158
2014/0063904 A1*  3/2014 Yon .......................... G11C 7/16
                                            365/148
2014/0321195 A1* 10/2014 Antonyan ........... G11C 11/1675
                                            365/148
2018/0025766 A1*  1/2018 Dietrich ............. G11C 11/2273
                                            365/65
2022/0230680 A1*  7/2022 Wu ..................... G11C 11/5678
2023/0041759 A1*  2/2023 Noack ................... G11C 7/067

FOREIGN PATENT DOCUMENTS

JP        2007207343 A  *  8/2007  ............. G11C 16/02

OTHER PUBLICATIONS

Translation of JP-2007207343-A (Year: 2007).*

* cited by examiner

*Primary Examiner* — Richard Elms
*Assistant Examiner* — Elizabeth Rose Agger
(74) *Attorney, Agent, or Firm* — Natalie A. Albrecht

(57) ABSTRACT

Disclosed herein are devices, methods, and systems for calibrating a read voltage level for reading memory cells of a memory. The calibration circuit includes a reference cell associated with a predefined programming state of the reference cell. The calibration circuit also includes a read circuit configured to (e.g., until a read state of the reference cell matches the predefined programming state), perform a read operation on the reference cell at a reference read voltage level to obtain a read state of the reference cell and adjust the reference read voltage level to an adjusted reference read voltage level based on a comparison between the read state and the predefined programming state. The read circuit is configured to provide the adjusted reference read voltage level to the memory as the read voltage level for reading the memory cells of the memory.

14 Claims, 8 Drawing Sheets

400

600

Set Initial Voltage Level ($V_{PL}$) for reading reference cell(s) — 610

Perform Read Operation using current $V_{PL}$ — 620

Does read state match predetermined programming state? (e.g., Vs read as "1")? — 630 no

Increase $V_{PL}$ ($V_{PL}=V_{PL}+\Delta$) — 640 yes

Provide $V_{PL}$ to Memory for Reading Memory Cells — 650

700

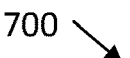

---

| Set Initial Voltage Level ($V_{PL}$) and select first reference cell(s) | 710 |

↓

| Perform Read Operation using $V_{PL}$ on selected reference cell(s) | 720 |

↓

730

Does read state match predetermined programming state? (e.g., Vs read as "1")?  —— no ——→  Increase $V_{PL}$ ($V_{PL}=V_{PL}+\Delta$)  740 yes ↓

742

Other reference cell(s) to check?  —— yes ——→  Select next reference cell(s) and use last $V_{PL}$ as initial $V_{PL}$ for next set  744 no ↓

| Provide $V_{PL}$ to Memory for Reading Memory Cells | 750 |

FIG. 7

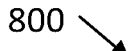

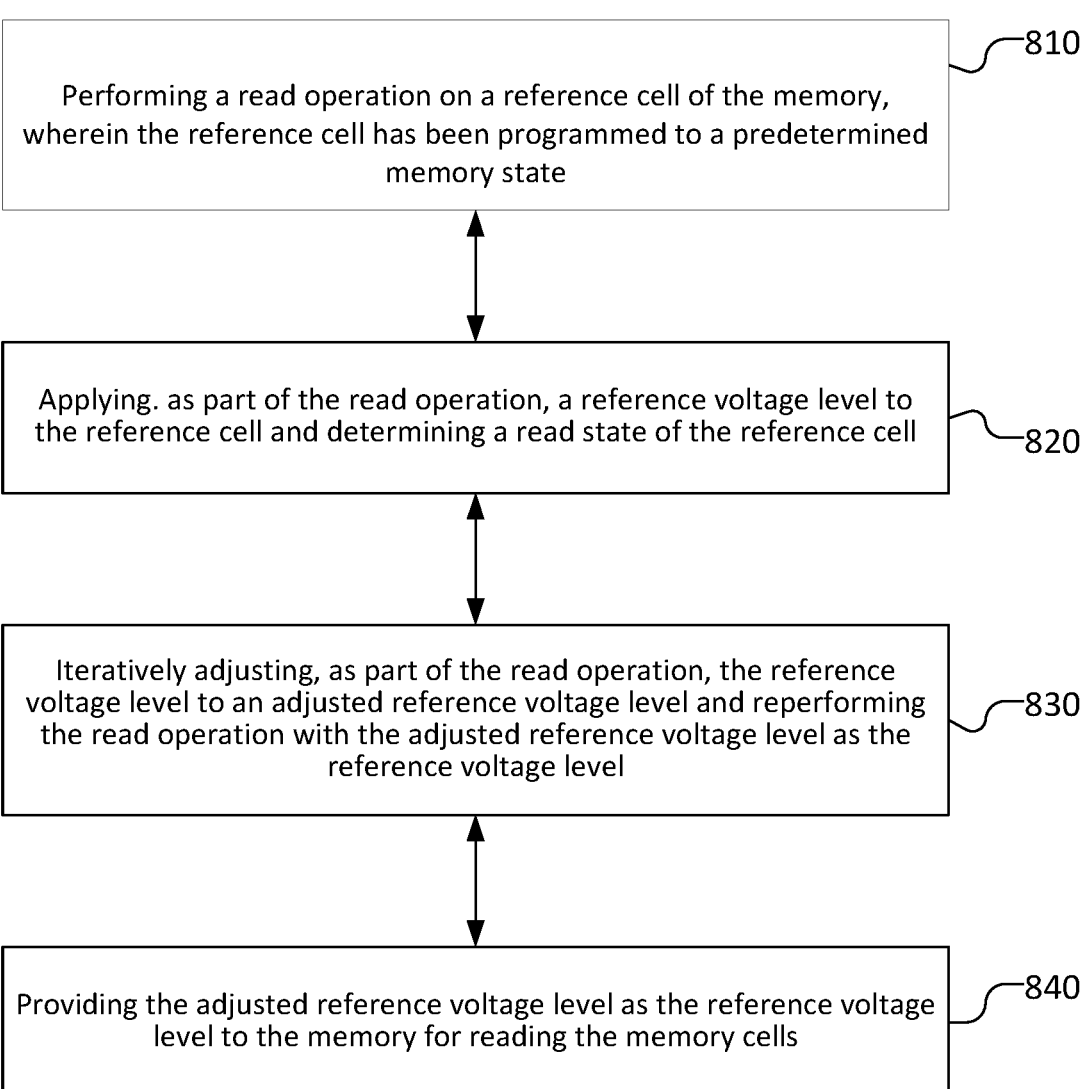

800

810
Performing a read operation on a reference cell of the memory, wherein the reference cell has been programmed to a predetermined memory state 820
Applying. as part of the read operation, a reference voltage level to the reference cell and determining a read state of the reference cell 830
Iteratively adjusting, as part of the read operation, the reference voltage level to an adjusted reference voltage level and reperforming the read operation with the adjusted reference voltage level as the reference voltage level 840
Providing the adjusted reference voltage level as the reference voltage level to the memory for reading the memory cells

FIG. 8

DEVICES, METHODS, AND SYSTEMS FOR CALIBRATING A READ VOLTAGE USED FOR READING MEMORY CELLS

TECHNICAL FIELD

This disclosure relates to non-volatile memories, and in particular, to memories that include state-programmable memory elements for storing the information.

BACKGROUND

Non-volatile memories allow for storing information in a memory, where the stored information is retained in the memory even after external power to the memory has been removed. Memories are typically formed from a number of memory cells, where each memory cell is able to store information in a state-programmable memory element (e.g., a ferroelectric memory element such as a ferroelectric capacitor) that is capable of retaining the written information based on a programmed state of the state-programmable memory element that is retained even after its power source has been removed. The programmed state usually represents a binary value (e.g., a "1" or a "0") that may be read out at later time by applying a read voltage sufficient to switch the state of the state-programmable memory element, and then determining the read state from the switching charge injected when the state-programmable memory element changes states. However, the switching charge generated by one cell may couple onto the control lines of other cells, causing a disturbance. Such a disturbance may cause the memory to read an incorrect state of the impacted cell(s). This may be particularly problematic in a memory with an "all bit line" (ABL) architecture, where multiple (e.g., all) bit lines may be read simultaneously, especially for long bit lines that may service memory cells far away from the virtual ground node of the sensing amplifier circuit used to read the memory cell.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 7 shows an exemplary flow diagram depicting how a calibration circuit may determine a read voltage from multiple reference cells that are selected and read in sequence; and FIG. 8 depicts an exemplary schematic flow diagram of a method for calibrating, based on reference cell(s), a read voltage to be used for reading memory cells of a memory.

DESCRIPTION

Figure 1:
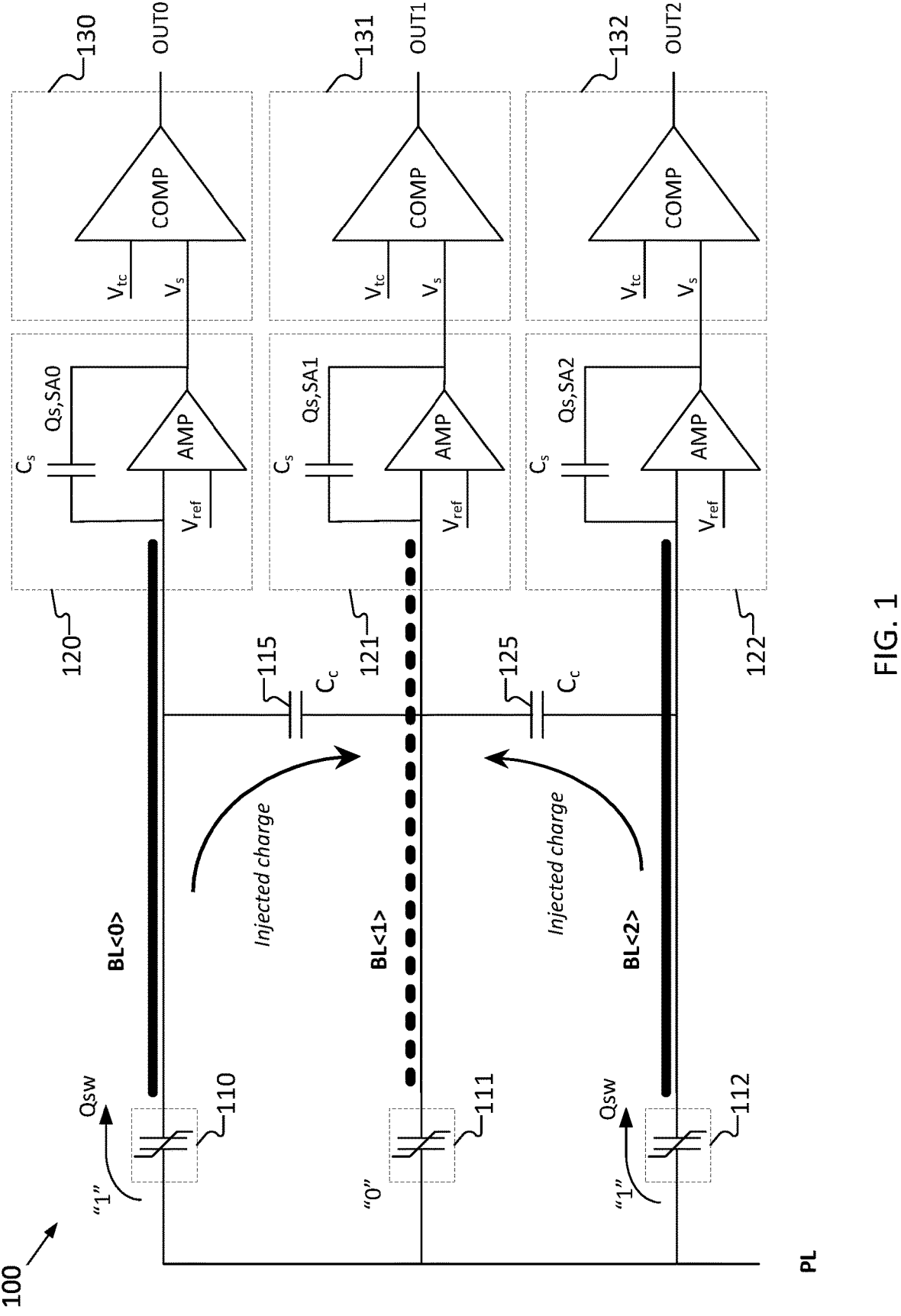
FIG. 1 shows an example of a memory architecture that may be susceptible to incorrect reads due to coupled charges from one bit line to another.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices. However, it may be understood that aspects described in connection with methods may similarly apply to the devices, and vice versa.

In general, non-volatile memories are typically formed from a number of memory cells, where each memory cell stores one of two states: a first state representing the off state (e.g., "0") and a second state representing the on state (e.g., "1"). The individual memory cells that form the memory are typically organized into control groupings of cells, where each cell may be individually addressed but have a common control scheme for biasing the cells via control lines such as bit lines (e.g., for operating the cells grouped in the same column), word lines (e.g., for operating cells grouped in the same row), and/or plate lines (e.g., for operating cells grouped so as to share a common node such as a same "plate"). Among other components, memory cells may include a state-programmable memory element (e.g., a ferroelectric memory element such as a ferroelectric capacitor) that is capable of retaining the written information by writing one of two remanent states of the memory element.

As used throughout this disclosure, a state of a memory element is described as "remanent" where the memory element is capable of retaining its programmed state even when it is not connected to a power source. As also used throughout, the current remanent state to which the memory element has been set may be referred to as the "stored" state, the "written" state, or the "programmed" state. As should be understood, when referring to a state-programmable memory element, the terms "write," "store," or "program" are used generically to refer to setting the remanent state of the state-programmable memory element(s). As is understood, the term "voltage" may be used herein with respect to "a bit line voltage", "a word line voltage," "a plate line voltage," and the like. The "voltage across" a component may be used herein to denote a voltage drop from a node on one side of a component (e.g., one side of a capacitor) to a node on the other side of the component (e.g., the other side of the capacitor).

When a state-programmable memory element includes ferroelectric material (e.g., a ferroelectric capacitor), the remanent state is understood as referring to a remanent polarization state that is set by applying a particular voltage across the element that is sufficient to set a corresponding polarization state, where, once set, the remanent polarization state is retained by the element even when the voltage across the element has been removed (e.g., it is remanently-polarizable). Once such an element has been state-programmed to a remanent state, it generally retains the programmed state until it is re-programmed by applying a voltage across it that is sufficient to program the element to a (e.g., new) remanent state. A polarization capability of a state-programmable memory element (e.g., remanent polarization capability, e.g., non-remanent spontaneous polarization capability) may be analyzed using capacity measurements (e.g., a spectroscopy), e.g., via a static (C-V) and/or time-resolved measurement or by polarization-voltage (P-V) or positive-up-negative-down (PUND) measurements. Another method for determining a polarization capability of a state-programmable memory element may include transmission electron microscopy, e.g., an electric-field dependent transmission electron microscopy.

As noted above, a typical memory includes multiple memory cells where each memory cell contains a memory element that represents information by being programmable to different states, each state corresponding to different stored information (e.g., a stored value of "0" may be represented by a first programming state and "1" may be represented by a second programming state). Once the memory element of the memory cell has been programmed, the programmed state may be read out using a read operation. In the read operation, a read voltage may be applied to the memory element to switch its programmed state and develop a charge in a sensing circuit, a sensed voltage of which may then be compared to a threshold reference voltage to determine the programmed state.

With certain memory cell configurations and sensing architectures, a disturb may occur on the control lines of the memory element, which may cause an incorrect read of the programming state of memory element. For example, in an All Bit Line (ABL) architecture, a group of memory elements may be read simultaneously by applying a read voltage to a plate line that is common to the group and then sensing the charge developed on each memory element's corresponding bit line. However, when the common read voltage is applied, the induced charge from one bit line (an "aggressor" bit line) may couple onto another bit line (a "victim" bit line). As a result, the coupled charge may cause an incorrect read of memory cells associated with the "victim" bit line.

Figure 2B:
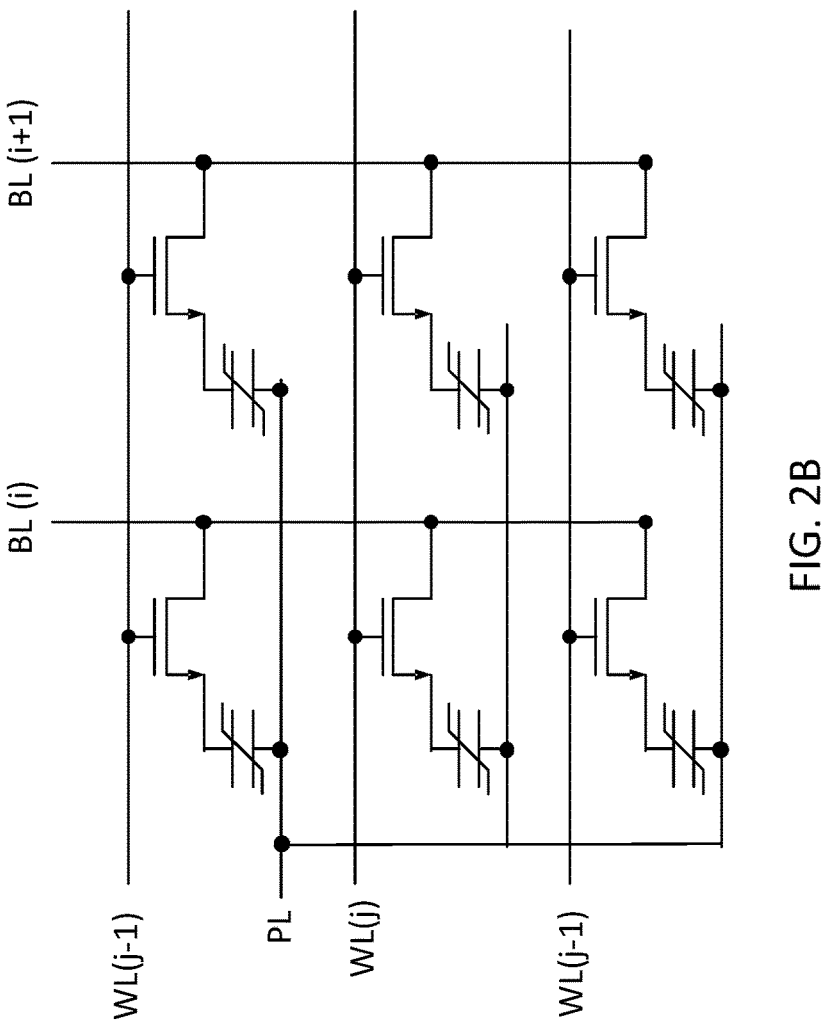
FIG. 2B depicts an example of multiple memory cells with a shared plate line and different groupings of cells with a common bit line(s) and/or common word line(s) for controlling the memory cells through access transistors.
Figure 2A:
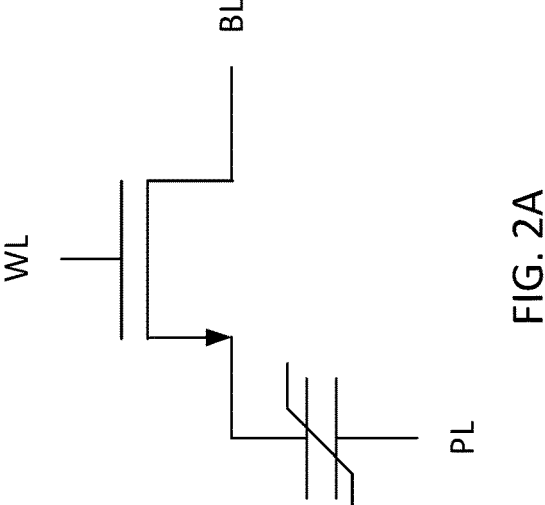
FIG. 2A shows an example configuration for controlling a memory cell via a plate line, word line, and bit line through an access transistor.

FIG. 1 shows an example of a memory 100 with a memory architecture (e.g., an ABL architecture) that may be susceptible to incorrect reads due to coupled charges from bit line to bit line. As should be appreciated, the depiction of the memory architecture in FIG. 1 is not meant to show all elements that would be part of memory 100, which may include, for example, access transistors operated by a word line (WL), as shown for example in FIG. 2A for a single memory cell and as shown in FIG. 2B for multiple memory cells with a shared plate line (PL) and different groupings of cells with a common bit line(s) (e.g., for columns controlled by BL(i) and BL(i+1), respectively) and/or common word line(s) (e.g., for rows controlled by WL(j) and WL(j−1), respectively). Rather, the depiction in FIG. 1 is merely used to show a potential source of disturbance when reading memory cells. Memory 100 has a group of three memory cells that are configured to be read-out at the same time: a first memory cell made of ferroelectric capacitor 110, a second memory cell made of ferroelectric capacitor 111, a third cell made of ferroelectric capacitor 112. Each memory cell of the group is fed by a common plate line (PL) on one side of each respective ferroelectric capacitor. The other side of each ferroelectric capacitor is connected to a corresponding bit line (BL), for example, through an access transistor. During a read operation of the group, a read circuit applies a read voltage to the common plate line (PL), which in turn may develop a switching charge to each individual bit line, depending on the programmed state of the memory cell and the applied read voltage. The read circuit then senses the switching charge in a sensing circuit (e.g., sensing circuits 120, 121, and 122) that converts the sensed charge (Qs) into a sensed voltage (Vs). The read circuit may then compare the sensed voltage in a comparison circuit (comparison circuits 130, 131, 132) that compares the sensed voltage to a predetermined threshold voltage to output the read state of the corresponding memory cell (e.g., at OUT0, OUT1, and OUT2).

As depicted in the example of FIG. 1, the first memory element (e.g., ferroelectric capacitor 110) has been programmed to a "1" state, the second memory element (e.g., ferroelectric capacitor 111) has been programmed to a "0" state, and the third memory element (e.g., ferroelectric capacitor 112) has been programmed to a "1" state. Assuming, for example, that when the read voltage is applied to the common PL, a memory cell programmed to a "1" state is configured to develop a charge Qsw onto its bit line and a memory cell programmed to a "0" state is configured to develop no charge onto its bit line. Typically, sensing circuits (e.g., sensing circuits 120, 121, 122) are used to convert the sensed charge (Qs) into a sensed voltage (Vs), and comparator circuits (e.g., comparator circuits 130, 131, and 132) are used to compare the sensed voltage to a predetermined threshold voltage defining the separation between one programming state and the other programming state. Ideally, the predetermined threshold would be set in the middle of the voltage range between the sensed voltage associated with a "0" and the sensed voltage associated with a "1."

With reference to sensing circuit 120 and comparison circuit 130 of FIG. 1, for example, the output of sensing circuit 120 (Vs) is proportional to the charge (Qs) which flows across the feedback or sensing capacitor (Cs) as compared to an input reference voltage (Vref):

$$Vs = Vref - Qs/Cs$$

Ideally (without disturb), in the above formula Qs=Qsw of the memory cell (e.g., ferroelectric capacitor 110), where the maximum Qsw (Qsw,max) is twice the remanent polarization of the ferroelectric capacitor 110 associated with the "1" state and Qsw is 0 when the ferroelectric capacitor 110 is programmed to the "0" state. If Vs0 is defined as the voltage corresponding to the charge developed by a "0" state of the ferroelectric capacitor 110 and Vs1 is defined as the voltage corresponding to the charge developed by a "1" state of the ferroelectric capacitor 110, it follows that:

$$Vs0 = Vref \ (\text{because } Qs = Qsw = 0)$$

-continued $$Vs1 = Vref - Qsw/Cs$$

Thus, it follows that:

$$|Vs1 - Vs0| = Qsw/Cs$$

The sensed voltage (Vs) is output to a comparing circuit 130 that compares a threshold voltage (Vtc) to the sensed voltage in order to determine whether the sensed voltage corresponds to a "0" state or "1" state. To do this, the threshold voltage is ideally set in the middle of the Vs1-Vs0 range:

$$Vtc = Vref - 1/2\ Qsw/Cs$$

Thus, in order for the comparing circuit 130 to correctly read the memory cell, the charge (Qs) across the feedback capacitor (Cs) to read the "0" state must be less than ½ Qsw and to read the "1" state must be greater than ½ Qsw.

However, when considering a large array of memory cells, there may be a large distribution in the charge developed by each memory cell and therefore a large distribution in charges developed across the feedback capacitor and therefore a large distribution in the sensed voltages associated with a "0" or with a "1." As such, the predetermined voltage may be set to the minimum voltage level sufficient read the lowest charge developed by the "1" state when considering the distribution (Qsw,min). With this in mind, the predetermined threshold voltage may be fixed to a value of:

$$Vtc = Vref - 1/2\ Qsw,\ min/Cs$$

And in order for the circuit to correctly read the "0" state, that the charge (Qs) across the feedback capacitor (Cs) must be less than ½ Qsw,min.

However, when the sensing and comparison circuits are configured to be able to read low developed charges (e.g., less than ½ Qsw,min), this may make them susceptible to misreading a disturbance as if it were the charge developed by the memory cell intended to be read (e.g., a disturbance in the form of a charge coupled onto the bit line from sources other than from the memory cell intended to be read), especially where the Qsw of a particular cell is much larger than Qsw,min. In other words, while the ideal charge developed in the sensing circuit (Qs) should be the switching charge (Qsw), a portion of the switching charge may be coupled to another bit line such that the actual charge developed in the sensing circuit is Qsw-Δ, where Δ is the disturbance charge coupled onto another bit line(s). If a bit line receives a disturbance from more than one bit line, for example from each of two adjacent bit lines, the disturbance charge may be doubled (e.g., 2Δ). If the total disturbance is high enough (e.g., it exceeds Qsw,min), the read operation may misread the state of the memory cell. An example of such a problem is discussed in more detail below, where a disturbance may be caused by a switching charge from a memory cell programmed to the "1" state (an "aggressor" bit line) that injects a portion of the switching charge onto a neighboring bit line (a "victim" bit line).

For example, with reference to FIG. 1, due to a coupling capacitance (Cc) between adjacent bit lines (e.g., coupling capacitance 115 between BL0 and BL1 and coupling capacitance 125 between BL1 and BL2), a portion of the switching charge developed on the bit lines associated with a programming state of "1" (BL0 and BL2) may be injected as a disturbance on the bit line associated with a programming state of "0" (BL1). Long bit lines may be particularly susceptible to such disturbances, where the memory cells are far away from the virtual ground node of the sense amplifier. If the injected disturbance charge is high enough (e.g., it exceeds Qsw,min), it may cause the sense circuit (e.g., sense circuit 121) to output a sense voltage such that the comparison circuit (e.g., comparison circuit 131) outputs an incorrect read result (e.g., OUT1 reflects a reading of "1" instead of "0").

To reduce the likelihood of disturbance causing a misread of memory cells, disclosed below is an improved circuit for calibrating the read voltage used to generate the switching charge across the memory cells during a read operation. In particular, a calibration circuit may be used to determine, based on a read of a reference memory cell set to a predefined programming state, a minimum voltage to apply during a read operation that correctly reads the predefined programming state. For example, in an ABL architecture, where the memory applies the read voltage to the plate line to generate a switching charge, the calibration circuit may determine the minimum plate line voltage that correctly reads the predefined programming state of a reference cell or group of reference cells, and then the memory may use this determined (e.g., minimum) plate line voltage to then read the memory cells. In this manner, the switching charge induced during a read operation of the memory cells may be kept below a safe threshold, such that disturb from aggressor cells onto victim cells is minimized and the read operation correctly reads the memory cells. As should be appreciated, while an ABL architecture has been used herein as an exemplary memory architecture in which the disclosed calibration circuit may be particularly useful, the disclosed calibration circuit may be applied to any type of memory architecture where calibrating a switching voltage level is desired.

Figure 3:
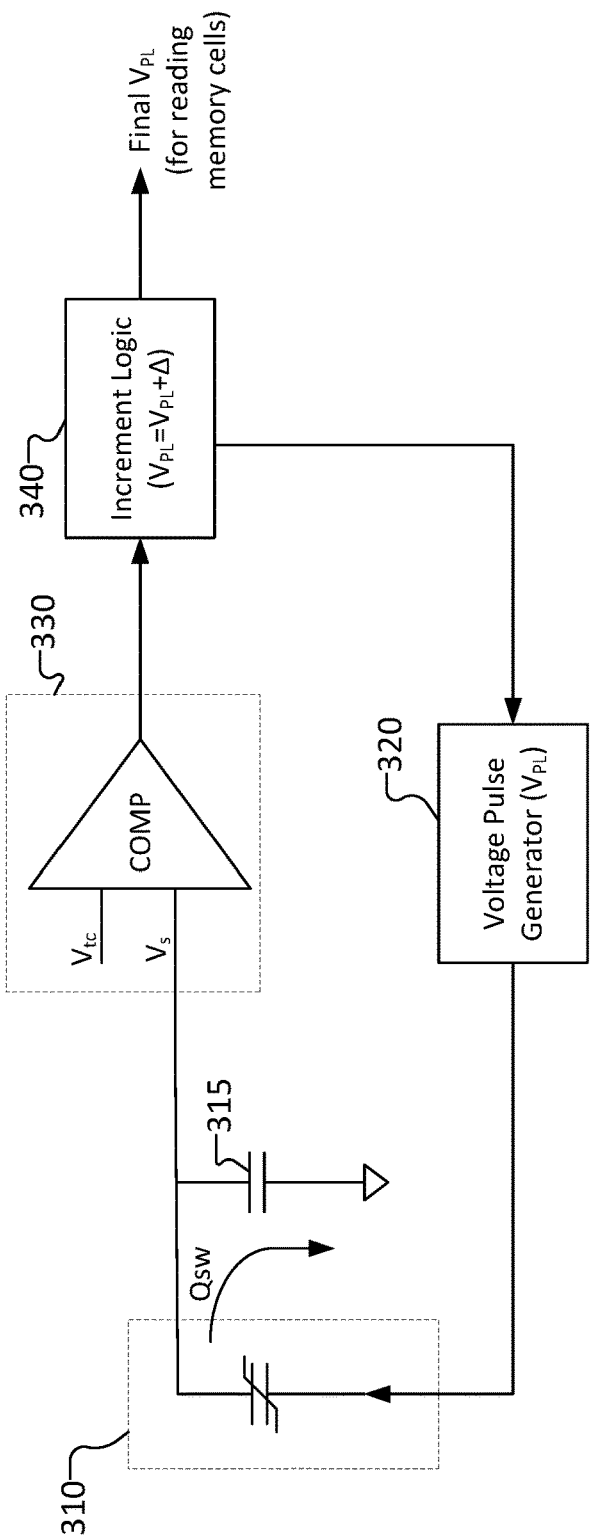
FIG. 3 illustrates an exemplary calibration circuit that uses a reference cell to determine a read voltage level to be used by the memory when reading a memory cell.

FIG. 3 shows an example of a calibration circuit 300 for determining a read voltage based on a reference cell 310. Reference cell 310 may be a memory cell of the memory (e.g., a state programmable memory element (e.g., a ferroelectric capacitor)) that is not used for storing memory information, but rather is used as a reference for determining an "ideal" read voltage. The reference cell 310 may be pre-programmed to a predetermined programmed state (e.g., a state associated with a "1" (e.g., a remanent polarization state of a ferroelectric capacitor that causes a switching charge when a voltage is applied across the capacitor to switch its programming state in a read operation)). The voltage applied across the capacitor in the read operation may be provided by a pulse generator 320 that initially provides a low voltage for reading the reference cell 310, and then the circuit may increment (e.g., increase) the applied voltage until the read operation successfully reads the predetermined programming state (e.g., the read state matches the predetermined state). Then, this determined voltage may then be provided to the memory for reading the memory cells of the memory.

The read operation of the calibration circuit 300 may be similar to that of the normal memory cells of the memory in that the voltage applied during the read operation is config-ured to generate a switching charge that develops a voltage (Vs) across a sensing circuit (e.g., sensing capacitor 315) and then the sensed voltage (Vs) is compared in comparison circuit 330 to the threshold voltage (Vtc) that defines the different programming states. As should be appreciated, while the sensing capacitor 315 and the threshold voltage (Vtc) of the calibration circuit 300 have similar functions to those that may be part of the sensing circuit and comparison circuit for reading the memory cells of the memory (e.g., sensing circuit 120 and comparison circuit 130 of FIG. 1), the values need not be identical to and may be proportional to and/or different from those used for reading the memory cells of the memory.

If the output of the comparison circuit 330 (e.g., the read state) matches the pre-programmed state, the calibration may be complete, and the applied voltage may then be used by the memory as the read voltage for reading the memory cells ($V_{PL}$). An increment logic circuit 340 may, if the output of the comparison circuit 330 (e.g., the read state) does not match the pre-programmed state, increment the applied voltage (e.g., $V_{PL}$ increased by $\Delta$ volts), and then the calibration circuit 300 repeats the read operation at the new voltage level. The calibration circuit 300 may repeat this process until the read state matches the programming state. In this manner, the calibration circuit 300 is able to deter-mine, based on the reference cell 310, the minimum voltage level ($V_{PL}$) for the memory to use during a read operation of the memory cells.

As should be understood, the calibration may be per-formed before each read operation of the memory, during power-up, at regular or irregular intervals, and/or based on any other trigger event (e.g., passage of time, when the temperature changes, after a certain number of read/write operations, etc.) so that the determined read voltage level ensures a correct read of the memory cells. As should also be understood, the sensing and comparison scheme is merely exemplary, and any type of sensing and comparison scheme may be used for determining the read state of the reference cell 310. In addition, it should be understood that the increment logic circuit 340 may be implemented as an analog circuit, digital circuit, or any combination thereof and the determined read voltage level may be provided to the memory in any manner. For example, the increment logic circuit 340 may use a digital to analog converter (DAC) to convert the read voltage level into a digital representation so that it may be counted, incremented, and/or provided to the voltage pulse generator 320 for generating the next voltage level for the next read operation during calibration and/or provided to the memory as the final voltage level to be used for reading the memory cells of the memory.

Figure 4:
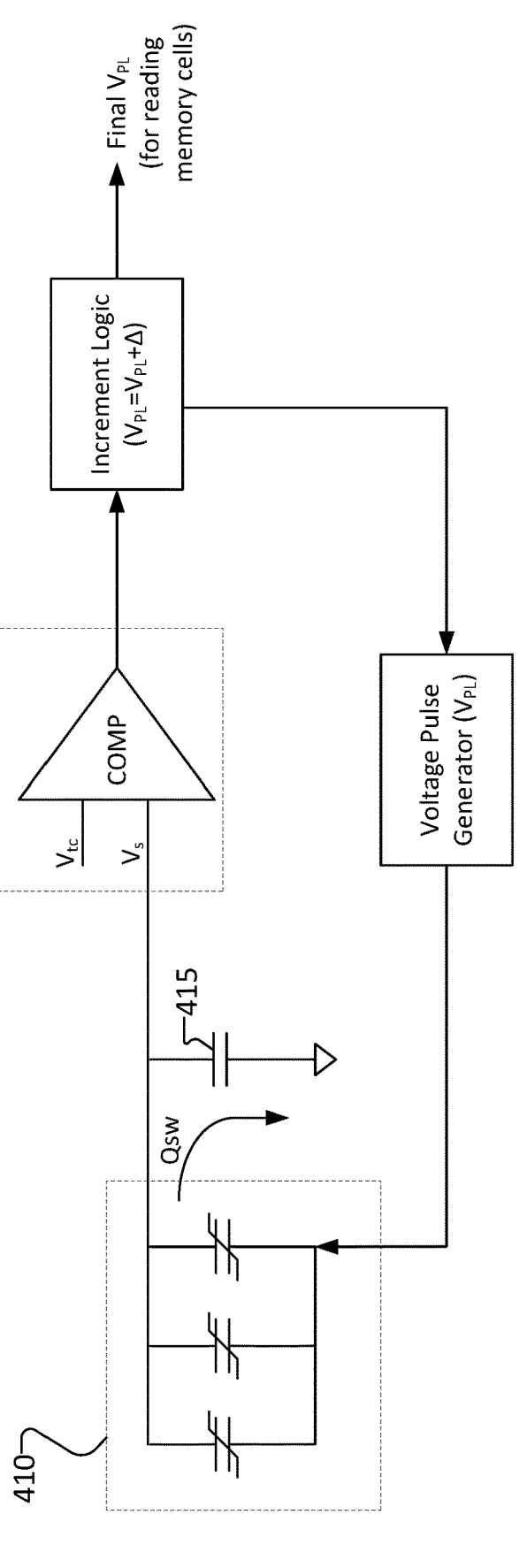
FIG. 4 depicts an exemplary calibration circuit that uses multiple reference cells in parallel to determine a read voltage level to be used by the memory when reading a memory cell.

As should also be appreciated, the reference cell 310 may include more than one cell (e.g., more than one state-programmable memory element (e.g., more than one ferro-electric capacitor)), which may be read by the calibration circuit 300 in a parallel (e.g., representing a median behav-ior) and/or in a sequential manner (e.g., representing a worst case). For example, FIG. 4 shows a calibration circuit 400 with a group of three reference cells 410 that are configured to be read in parallel during a read operation of the calibra-tion circuit 400, where the charge developed to capacitor 415 is the cumulative charge (e.g., median charge) of the group of three reference cells 410. As with the calibration circuit 300, the reference cells 410 may be read by applying an initial read voltage level that is increased until the read state matches the pre-programmed predetermined program-ming state of the reference cells 410. While three cells are shown in FIG. 4, this is merely exemplary and any number of cells may be used for the reference cells 410.

Figure 5:
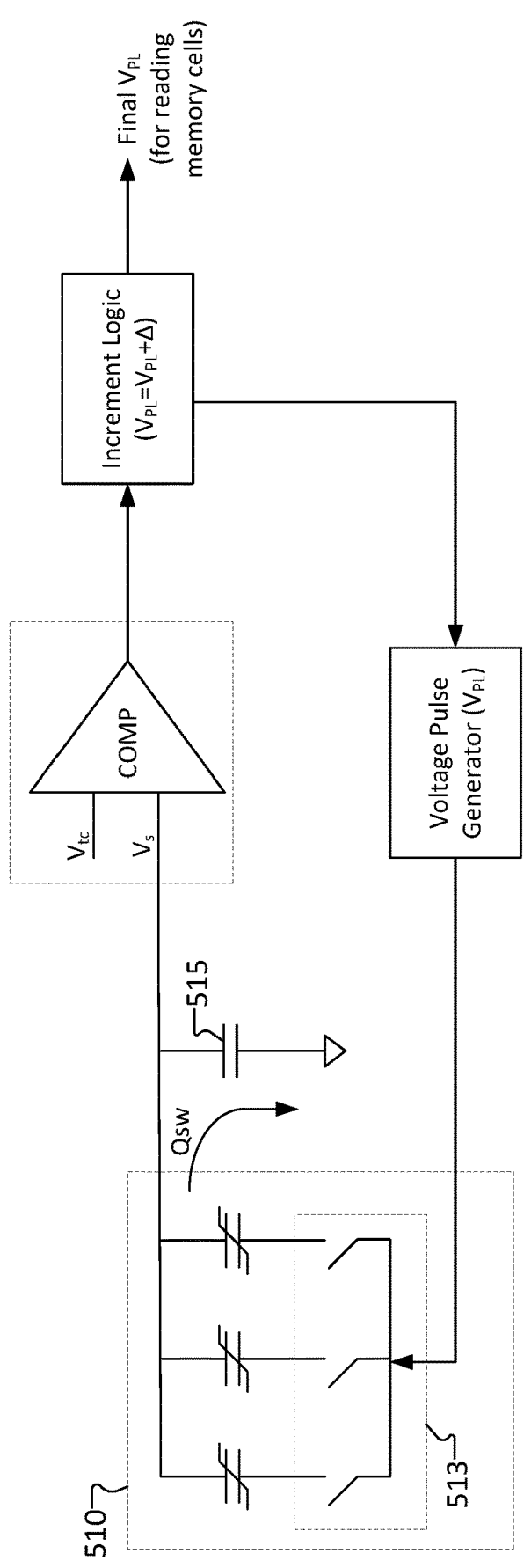
FIG. 5 depicts an exemplary calibration circuit that uses multiple reference cells in sequence to determine a read voltage level to be used by the memory when reading a memory cell.

As another example, FIG. 5 shows a calibration circuit 500 with three reference cells 510 that are configurable to be read in sequence (e.g., individually) during a read operation of the calibration circuit 500, where the charge developed to capacitor 515 is the charge developed by a selected one of the reference cells 510. For example, one or more switches 513 may be used to selectively switch an individual one of the reference cells 510 as the selected reference cell to be used during the read operation of the calibration circuit 500. As with the calibration circuits 300 and 400, an initial read voltage level is applied to the first selected reference cell and the read voltage level is increased until the read state of the first selected reference cell matches the pre-programmed predetermined programming state of the reference cells 510. After the calibration circuit 500 has determined the mini-mum read voltage level for the first selected cell, the calibration circuit 500 may select (e.g., using switches 513) another one of the reference cells 510, and, starting with the minimum read voltage level determined for the first selected cell, check whether the read state of the second reference cell matches the pre-programmed predetermined program-ming state, increasing the read voltage level until the read state of the second reference cell matches the pre-pro-grammed predetermined programming state. This process may be repeated for each cell of the reference cells 510. In this manner, the resulting read voltage level provided by the calibration circuit to the memory represents the worst case voltage level needed to accurately read the group of refer-ence cells 510. As should be understood, any number of cells may make up the reference cells 510.

As should also be appreciated, the calibration circuit (e.g., calibration circuit 300, 400, and/or 500) may use any combination of the parallel and sequential methods dis-cussed above. For example, with reference to FIG. 5, calibration circuit 500 may select N multiple cells (e.g., not just an individual cell, but any number N) from reference cells 510, where the composite charge provided by the N multiple cells represent the median charge over the N selected cells, and then determine the minimum read voltage level necessary to correctly read the N selected cells. Then, the calibration circuit 500 may sequentially select other grouping(s) of N multiple cells from reference cells 510 (e.g., using switches 513), and starting with the minimum read voltage level determined for the first N multiple cells, check whether the read state of the second set of N multiple cells matches the pre-programmed predetermined program-ming state and increasing the read voltage level until the read state of the second set of N multiple cells matches the pre-programmed predetermined programming state.

Figure 6:
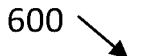
FIG. 6 shows an exemplary flow diagram depicting how a calibration circuit may determine a read voltage from a reference cell or reference cells that are read in parallel.
Figure 6:
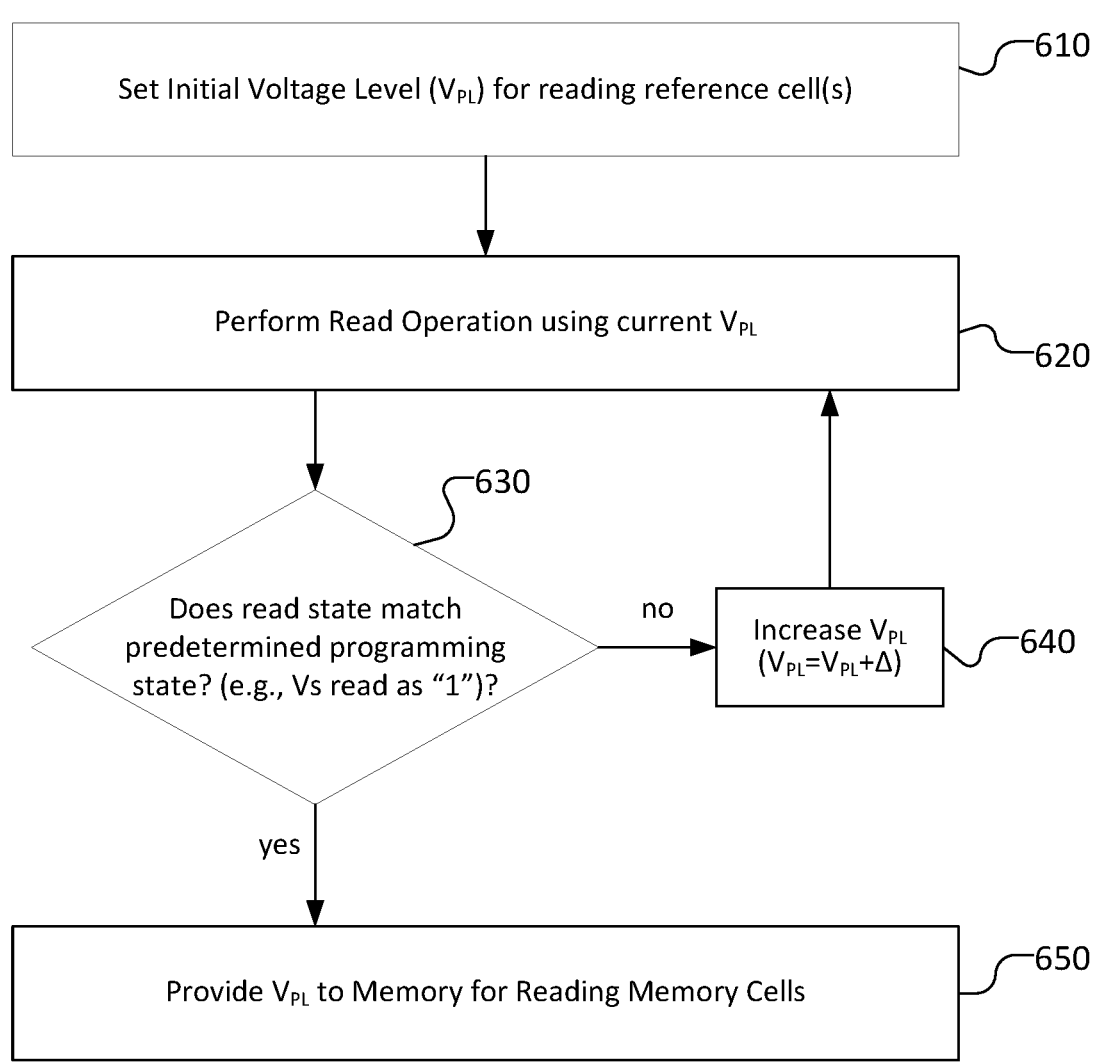

FIG. 6 is an exemplary flow diagram 600 depicting how the calibration circuit (e.g., calibration circuit 300, 400, and/or 500) may determine the read voltage for a memory to use when reading memory cells. The calibration circuit may, in 610, set an initial voltage level (e.g., a low voltage level) to be applied to the reference cell(s) as $V_{PL}$ when reading the reference cell(s). Next, the calibration circuit may, in 620, perform a read operation by applying a read voltage at the initial voltage level ($V_{PL}$). Next, the calibration circuit may, in 630, determine whether the read state matches the pre-determined programming state of the reference cell(s). If not, the read voltage level is increased (e.g., $V_{PL}$ is increased by $\Delta$ volts as illustrated in 640), and the read operation in 620 and following steps are performed again using the increased voltage level. (As should be appreciated, the sensing capacitor (e.g., capacitor 415 of calibration circuit

400 or capacitor 515 of calibration circuit 500) must be allowed to discharge between successive read operations.) If, in 630, the read state matches the predetermined programming state, the calibration is complete, and the calibration circuit may, in 650, provide the final read voltage level ($V_{PL}$) to the memory for reading the memory cells.

FIG. 7 is an exemplary flow diagram 700 depicting how the calibration circuit (e.g., calibration circuit 300, 400, and/or 500) may determine the read voltage level for a memory to use when reading memory cells. The calibration circuit may, in 710, select a first reference cell(s) and set an initial voltage level (e.g., a low voltage level) to be applied to the selected reference cell(s) when reading the selected reference cell(s). Next, the calibration circuit may, in 720, perform a read operation by applying a read voltage at the initial voltage level ($V_{PL}$). Next, the calibration circuit may, in 730, determine whether the read state matches the predetermined programming state of the reference cell(s). If not, the read voltage level is increased (e.g., $V_{PL}$ is increased by Δ volts as illustrated in 740), and the read operation in 720 and following steps are performed again using the increased voltage level. If, in 730, the read state matches the predetermined programming state, the calibration checks, in 742, if there are other reference cell(s) to check. If so, the next reference cell(s) are selected in 744 and the last $V_{PL}$ is used as the initial $V_{PL}$ for the next reference cell(s). (As should be appreciated, the sensing capacitor (e.g., capacitor 315 of calibration circuit 300, capacitor 415 of calibration circuit 400, or capacitor 515 of calibration circuit 500) must be allowed to discharge between successive read operations.) The process then returns to 720 to repeat the process for reading the selected reference cell(s), checking whether the read state matches, and increasing $V_{PL}$ until the reference cell(s) are read correctly. If, in 742, there are no other reference cell(s) to check, the calibration is complete, and the calibration circuit may, in 750, provide the final read voltage level ($V_{PL}$) to the memory for reading the memory cells.

FIG. 8 depicts an exemplary schematic flow diagram 800 of a method for calibrating, based on a reference cell or cells, a read voltage to be used for reading memory cells of a memory. Method 800 may implement any of the features and/or structures described above with respect to the configuration circuit (e.g., configuration circuits 300, 400, and 500) described above with respect to FIGS. 1-7.

Method 800 includes, in 810, performing a read operation on a reference cell of the memory, wherein the reference cell has been programmed to a predetermined memory state. Performing the read operation comprises, in 820, applying a reference voltage level to the reference cell and determining a read state of the reference cell. Performing the read operation comprises, in 830, iteratively adjusting the reference voltage level to an adjusted reference voltage level and reperforming the read operation with the adjusted reference voltage level as the reference voltage level. The method also includes, in 840, providing the adjusted reference voltage level as the reference voltage level to the memory for reading the memory cells.

In the following, various examples are provided that may include one or more aspects described above with reference to calibrating a read voltage to be used for reading memory cells of a memory. It may be intended that aspects described in relation to the circuits may apply also to the described method(s), and vice versa.

Example 1 is a circuit for calibrating a read voltage level used for reading memory cells of a memory, the circuit including a reference cell associated with a predefined programming state of the reference cell. The circuit also includes a read circuit configured to (e.g., until a read state of the reference cell matches the predefined programming state) perform a read operation on the reference cell at a reference read voltage level to obtain a read state of the reference cell. Read circuit is also configured to adjust the reference read voltage level to an adjusted reference read voltage level based on a comparison between the read state and the predefined programming state. The read circuit is also configured to provide the adjusted reference read voltage level to the memory as the read voltage level for reading the memory cells of the memory.

Example 2 is the circuit of example 1, wherein the read circuit is configured to determine the read state based on a comparison result of a sensed voltage level compared to a predefined threshold voltage level associated with the read state.

Example 3 is the circuit of either of examples 1 or 2, wherein the reference cell includes a state-programmable memory element.

Example 4 is the circuit of example 3, wherein the state-programmable memory element includes a remanent-polarizable capacitor, wherein the predefined programming state includes one of a plurality of remanently-polarizable states of the remanent-polarizable capacitor.

Example 5 is the circuit of example 4, wherein the sensed voltage level is associated with a switching charge provided during the read operation when the remanent-polarizable capacitor is programmed from the predefined programming state to another of the plurality of remanently-polarizable states.

Example 6 is the circuit of example 5, wherein the read circuit includes a sensing circuit configured to accumulate the switching charge across a sensing capacitor during the read operation.

Example 7 is the circuit of example 2, wherein the read circuit includes a comparator circuit configured to compare the sensed voltage level to the predefined threshold voltage level. The comparator circuit is also configured to output the comparison result as a representation of the read state.

Example 8 is the circuit of any one of examples 1 to 7, wherein the reference cell includes a plurality of reference cells, each associated with the predefined programming state, wherein the reference cell includes one of the plurality of reference cells.

Example 9 is the circuit of example 8, wherein the read circuit configured to perform the read operation and adjust the reference read voltage level includes the read circuit configured to (e.g., until the read state of the plurality of reference cells matches the predefined programming state) perform as the read operation a parallel read operation on the plurality of reference cells at the reference read voltage level. It also includes the read circuit configured to increase the reference read voltage level to the adjusted reference read voltage level based on the comparison.

Example 10 is the circuit of example 9, wherein the parallel read operation includes accumulating from the plurality of reference cells a cumulative switching charge across a sensing capacitor.

Example 11 is the circuit of example 10, wherein the cumulative switching charge across the sensing capacitor defines a sensing voltage level, wherein the read circuit is configured to determine the read state based on a comparison of the sensing voltage level to a predefined threshold voltage level associated with the read state.

Example 12 is the circuit of any one of examples 1 to 11, wherein the read circuit configured to perform the read operation and adjust the reference read voltage level includes the read circuit configured to perform as the read operation a series of individual read operations at the reference read voltage level, wherein each one of the series of individual read operations is of an individual one of the plurality of reference cells and includes an individual read state, wherein the read circuit is configured to, for each one of the series of individual read operations (e.g., until the individual read state matches the predefined programming state) adjust the reference read voltage level to the adjusted reference read voltage level based on an individual comparison between the individual read state and the predefined programming state.

Example 13 is the circuit of example 12, wherein each one of the series of individual read operations includes accumulating from the individual one of the plurality of reference cells a switching charge across a sensing capacitor.

Example 14 is the circuit of example 13, wherein the switching charge across the sensing capacitor defines a sensing voltage level, wherein the read circuit is configured to determine the read state based on a comparison of the sensing voltage level to a predefined threshold voltage level associated with the read state.

Example 15 is a memory including a plurality of reference cells. The memory also includes a plurality of memory cells. The memory also includes a calibration circuit configured to determine a read voltage level based on an iterative read operation of the plurality of reference cells. The memory also includes a memory read circuit configured to read the plurality of memory cells using the read voltage level. In some aspects, the memory read circuit is configured to read at least two memory cells of the plurality of memory cells simultaneously, wherein the at least two memory cells have two directly adjacent bit lines associated therewith.

Example 16 is the memory of example 15, wherein the calibration circuit configured to determine the read voltage level based on the iterative read operation comprises the calibration circuit configured to individually read a read state of each reference cell of the plurality of reference cells with a reference read voltage level and increasing the reference read voltage level until, for each reference cell, the read state matches a predefined programming state. It also includes the calibration circuit configured to provide to the memory read circuit the reference read voltage level as the read voltage level.

Example 17 is the memory of example 15, wherein the calibration circuit configured to determine the read voltage level based on the iterative read operation comprises the calibration circuit configured to read a composite read state of the plurality of reference cells with the reference read voltage level and increasing the reference read voltage level until the composite read state matches a predefined programming state. It also includes the calibration circuit configured to provide to the memory read circuit the reference read voltage level as the read voltage level.

Example 18 is a method for calibrating a reference voltage level for reading memory cells of a memory, the method including performing a read operation on a reference cell of the memory, wherein the reference cell has been programmed to a predetermined memory state, wherein performing the read operation includes applying a reference voltage level to the reference cell and determining a read state of the reference cell. The method also includes iteratively adjusting the reference voltage level to an adjusted reference voltage level and reperforming the read operation with the adjusted reference voltage level as the reference voltage level (e.g., until the determined read state corresponds to the predetermined memory state). The method also includes providing the adjusted reference voltage level as the reference voltage level to the memory for reading the memory cells.

Example 19 is the method of example 18, wherein the reference cell is one of a plurality of reference cells of the memory, wherein performing the read operation includes performing the read operation on the plurality of reference cells, each of which has been set to the predetermined memory state, wherein applying the reference voltage level includes applying to the plurality of reference cells the reference voltage level in parallel and determining the read state includes determining a composite read state of the plurality of reference cells.

Example 20 is the method of example 18, wherein the reference cell is one of a plurality of reference cells of the memory, wherein performing the read operation includes selecting a first reference cell of the plurality of reference cells as a selected reference cell for the read operation, wherein performing the read operation includes applying the reference voltage level to the selected reference cell and determining the read state of the selected reference cell. Performing the read operation also includes, wherein after iteratively adjusting the reference voltage level to the adjusted reference voltage level for the selected reference cell, selecting a second reference cell of the plurality of reference cells as the selected reference cell and reperforming the read operation and adjusting the reference voltage level to the adjusted reference voltage level for the selected reference cell.

The terms "at least one" and "one or more" may be understood to include any integer number greater than or equal to one, i.e., one, two, three, four, [ . . . ], etc. The term "a plurality" or "a multiplicity" may be understood to include any integer number greater than or equal to two, i.e., two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "connected" may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term "electrically conductively connected" may be also referred to as "galvanically connected".

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

The invention claimed is:

1. A circuit for calibrating a read voltage level used for reading memory cells of a memory, the circuit comprising:

a reference cell associated with a predefined programming state of the reference cell;

a read circuit configured to:

perform a read operation on the reference cell at a reference read voltage level to obtain a read state of the reference cell;

increase the reference read voltage level to an adjusted reference read voltage level when the predefined programming state is higher than the reference read voltage level; and provide the adjusted reference read voltage level to the memory as the read voltage level for reading the memory cells of the memory.

2. The circuit of claim 1, wherein the read circuit is configured to determine the read state based on a comparison result of a sensed voltage level compared to a predefined threshold voltage level associated with the read state.

3. The circuit of claim 1, wherein the reference cell comprises a state-programmable memory element.

4. The circuit of claim 3, wherein the state-programmable memory element comprises a remanent-polarizable capacitor, wherein the predefined programming state comprises one of a plurality of remanently-polarizable states of the remanent-polarizable capacitor.

5. The circuit of claim 1, wherein the read state is associated with a switching charge provided during the read operation.

6. The circuit of claim 5, wherein the read circuit comprises a sensing circuit configured to accumulate the switching charge across a sensing capacitor during the read operation.

7. The circuit of claim 2, wherein the read circuit comprises a comparator circuit configured to:

compare the sensed voltage level to the predefined threshold voltage level; and output the comparison result as a representation of the read state.

8. The circuit of claim 1, wherein the reference cell comprises a plurality of reference cells, each associated with the predefined programming state, wherein the reference cell comprises one of the plurality of reference cells.

9. The circuit of claim 8, wherein the read circuit configured to perform the read operation and adjust the reference read voltage level comprises the read circuit configured to:

perform as the read operation a parallel read operation on the plurality of reference cells at the reference read voltage level; and increase the reference read voltage level to the adjusted reference read voltage level based on the comparison.

10. The circuit of claim 1, wherein the reference cell comprises a plurality of reference cells, each associated with the predefined programming state, wherein the reference cell comprises one of the plurality of reference cells, wherein the read circuit configured to perform the read operation and adjust the reference read voltage level comprises the read circuit configured to:

perform as the read operation a parallel read operation on the plurality of reference cells at the reference read voltage level; and increase the reference read voltage level to the adjusted reference read voltage level based on the comparison, wherein the parallel read operation comprises accumulating from the plurality of reference cells a cumulative switching charge across a sensing capacitor.

11. The circuit of claim 10, wherein the cumulative switching charge across the sensing capacitor defines a sensing voltage level, wherein the read circuit is configured to determine the read state based on a comparison of the sensing voltage level to a predefined threshold voltage level associated with the read state.

12. The circuit of any one of claims 1 to 11, wherein the read circuit configured to perform the read operation and adjust the reference read voltage level comprises the read circuit configured to:

perform as the read operation a series of individual read operations at the reference read voltage level, wherein each one of the series of individual read operations is of an individual one of the plurality of reference cells and comprises an individual read state, wherein the read circuit is configured to, for each one of the series of individual read operations adjust the reference read voltage level to the adjusted reference read voltage level based on an individual comparison between the individual read state and the predefined programming state.

13. The circuit of claim 12, wherein each one of the series of individual read operations comprises accumulating from the individual one of the plurality of reference cells a switching charge across a sensing capacitor.

14. The circuit of claim 13, wherein the switching charge across the sensing capacitor defines a sensing voltage level, wherein the read circuit is configured to determine the read state based on a comparison of the sensing voltage level to a predefined threshold voltage level associated with the read state.

* * * * *